United States Patent [19]

Brahim et al.

[11] Patent Number: 4,720,445
[45] Date of Patent: Jan. 19, 1988

[54] COPOLYMERS FROM MALEIMIDE AND ALIPHATIC VINYL ETHERS AND ESTERS USED IN POSITIVE PHOTORESIST

[75] Inventors: Karime Brahim, Hamilton Square; Michael J. McFarland, Middlesex, both of N.J.

[73] Assignee: Allied Corporation, Morristown, N.J.

[21] Appl. No.: 829,874

[22] Filed: Feb. 18, 1986

[51] Int. Cl.$^4$ .................. G03C 1/60; G03C 1/495
[52] U.S. Cl. .................. 430/192; 430/270; 430/326; 430/330
[58] Field of Search .............. 430/192, 176, 171, 270, 430/283, 281, 326, 197, 330

[56] References Cited

U.S. PATENT DOCUMENTS

| | | | |
|---|---|---|---|
| 3,402,044 | 9/1968 | Steinhoff et al. | |
| 3,634,082 | 1/1972 | Christensen | 430/192 |
| 3,869,292 | 3/1975 | Peters | 430/197 |
| 3,900,325 | 8/1975 | Christensen et al. | 430/192 |
| 3,920,618 | 11/1975 | Ichimura et al. | 430/300 |
| 3,964,908 | 6/1976 | Bargon et al. | |
| 4,079,041 | 3/1978 | Baumann et al. | |
| 4,093,461 | 6/1978 | Loprest et al. | |
| 4,246,374 | 1/1981 | Kopchik | |
| 4,266,005 | 5/1981 | Nakamura et al. | |
| 4,415,652 | 11/1983 | Proskow | |
| 4,426,247 | 1/1984 | Tamamura et al. | |
| 4,524,121 | 6/1985 | Gleim et al. | 430/156 |
| 4,544,621 | 10/1985 | Roth | 430/281 |
| 4,547,455 | 10/1985 | Hiramoto et al. | |
| 4,569,897 | 2/1986 | Kalyanaraman | 430/197 |
| 4,609,705 | 9/1986 | Crivello et al. | 524/548 |
| 4,663,268 | 5/1987 | Turner et al. | 430/270 |

OTHER PUBLICATIONS

Bobb et al., Research Disclosure, 6/1975, pp. 51–53.
DeForest, W. S., "Photoresist Materials and Processes", McGraw-Hill Book Co., 1975, pp. 47–49 and 55–59.
M. J. Bowden, ACS Symposium Series 266, 1984, pp. 39–117.
D. A. Vidusek et al, "A Totally Aqueous Developable Bilayer Resist System", *SPIE*, vol. 539, (1985), pp. 103–114.
Anon, "Improved Photoresists for Integrated Circuit Chips Devised", C & EN, Oct. 7, 1985, pp. 27–29.
G. Van Paesschen et al., The Copolymerization of Maleimide, Makromol Chem., 1964, 78, pp. 112–120.

*Primary Examiner*—Charles L. Bowers, Jr.
*Attorney, Agent, or Firm*—Harold N. Wells; Jay P. Friedenson

[57] ABSTRACT

A novel positive photoresist formulation is provided based on a 1:1 copolymer of maleimide and an aliphatic vinyl ether or ester in combination with a photoactive sensitizer capable of undergoing a change in aqueous alkaline solubility upon exposure to actinic radiation. The copolymers disclosed have structures of the following type:

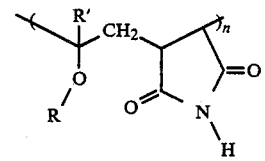

where R is an alkyl substituent of from 1 to 20 carbon atoms, benzyl, $C_1$ to $C_{10}$ aralkyl, $C_3$ to $C_{12}$ cycloalkyl or

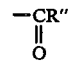

where R" has the structures assigned to R, and where R' is independently H, $C_1$ to $C_{10}$ alkyl, phenyl, benzyl or $C_1$ to $C_{10}$ aralkyl. The polymers are compounded with a photoactive sensitizer capable of undergoing a change in aqueous alkaline solubility upon exposure to actinic radiation such as with diazonaphthoquinone sulfonic acid esters and amides. The polymer and sensitizer compositions are dissolved together in a solvent useful for spin casting of thin films on substrates.

10 Claims, No Drawings

COPOLYMERS FROM MALEIMIDE AND ALIPHATIC VINYL ETHERS AND ESTERS USED IN POSITIVE PHOTORESIST

REFERENCE TO PRIOR APPLICATION

The present application is a continuation-in-part of co-pending U.S. Patent Application Ser.No. 814,591 filed Jan. 2, 1986, now abandoned which is a File Wrapper Continuation Application of U.S. Ser. No. 547,815, filed Nov. 1, 1983, and now abandoned. In that copending application, positive photoresist compositions comprising known alkali solubilizable compounds with a novel class of polymers containing the —(CO—N-H—CO)— moiety and, in particular, copolymers of maleimide and styrene or substituted styrene are disclosed. The present application utilizes, in the photoresist system, polymers obtained from the copolymerization of maleimide with aliphatic vinyl ethers or esters.

This invention relates to positive photoresist compositions suitable for deep ultraviolet (DUV) lithography, as well as, for mid UV or conventional near UV lithography. The photoresist compositions of the invention are based on copolymers of maleimide with aliphatic vinyl ethers or esters and a photosensitizer which changes solubility upon exposure to actinic radiation in the desired spectral range. The copolymers of the invention are characterized by excellent transparency in the DUV region and excellent adhesion to substrates and include copolymer variations that unexpectedly demonstrated very high constrast behavior in photoresist formulations.

BACKGROUND OF THE INVENTION

The practice of microlithography in the electronics industry generally involves the irradiation, through a mask, of a substrate coated with photosensitive material called "photoresist". After exposure, there exists a differential solubility in developer solution between those areas that received irradiation and those masked over. Those photoresists that become more soluble in the irradiated areas are designated "positive" photoresists and the photoresists of the invention fall in this category. The differential solubility of the resist areas leads to a relief image in the shape of the original mask pattern after development is complete. This pattern is then the basis for patterning the semiconductor substrate in further processing steps.

Conventional near ultraviolet (NUV) lithography is practiced in the prior art using novolac resins in combination with diazonaphthoquinone sensitizers. The NUV region of the spectrum covers the range of 350-450 nm. Since the wavelength of the exposing radiation is a factor in determining the ultimate resolution of the photoresist image, there is considerable impetus to practice lithography in the DUV region (220-300 nm). By using this shorter wavelength light, the ultimate resolution of the image is improved which in turn allows for device geometries to continue shrinking.

Conventional resists utilizing novolac technology are not useful in the DUV region due to the excessive absorption of these phenolic polymers. In the prior art, M. J. Bowden describes a number of research efforts to produce a deep UV photoresist system in a monograph found in, ACS Symposium Series #266, *Materials for Microlithography*, L. F. Thompson, Ed., ACS 1984, p. 39. In addition, copolymers of maleimide with styrene and substituted styrenes used as photoresist are described in the co-pending application of Hopf, et al., U.S. Ser. No. 547,815 filed on Nov. 1, 1983.

Accordingly, a need exists for DUV photoresists and more specifically for a class of resins to service as a DUV transparent, aqueous alkaline soluble polymeric vehicle for photosensitive compounds.

SUMMARY OF THE INVENTION

In accordance with the invention, a novel positive photoresist formulation is provided based on a copolymer of maleimide and an aliphatic vinyl ether or ester in combination with a photoactive sensitizer capable of undergoing a change in aqueous alkaline solubility upon exposure to actinic radiation.

The novel copolymers of the invention have structures of the following type:

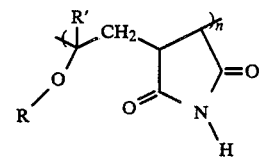

wherein R is an alkyl substituent of from 1 to 20 carbon atoms, benzyl, $C_1$ to $C_{10}$ aralkyl, $C_3$ to $C_{12}$ cycloalkyl or

radical where R'' has the structure assigned to R, and where R' is independently H, $C_1$ to $C_{10}$ alkyl, phenyl, benzyl or $C_1$ to $C_{10}$ aralkyl. The novel polymers of the invention are compounded with a photoactive sensitizer capable of undergoing a change in aqueous alkaline solubility upon exposure to actinic radiation, such as the diazonaphthoquinone sulfonic acid esters and amides disclosed in J. Kosar, *Light-Sensitive Systems*, Wiley & Sons, 1965, pp. 343-352. Other useful photosensitive compounds are found in the co-pending applications of Hopf, et al., U.S. Ser. No. 547,815 (filed on Nov. 1, 1983) in Tables I and II, and U.S. Ser. No. 805,641 filed Dec. 6, 1985. The polymer and sensitizer are dissolved together in a solvent useful for spin casting of thin films on substrates. Useful solvents or solvent mixtures are typified by good solubilization of both solid components, ability to spincast uniform, striation-free films and lack of chemical reactivity towards the solutes. Examples of useful solvents include 2-methoxyethyl ether (diglyme), dimethyl formamide, cyclohexanone and N-methyl pyrrolidinone.

In practicing the invention, the copolymers of the invention and a photosensitizer are compounded in a solvent to provide a composition suitable for spin casting. The photoresist solution is then spin cast onto a substrate such as a silicon wafer, a silicon wafer with a layer of thermally grown oxide or a chrome plated quartz plate. The substrate with a thin layer of photoresist on it is then baked to remove any remaining solvent. The result is a substrate with a layer of dry photoresist from 0.5 to 6 microns in thickness. The polymers of the invention are characterized by good solubility in aqueous alkaline solutions (developer). This solubility is imparted by virtue of the acidic imide group in the succinimide moieties in the polymer chain. The purpose of the sensitizer is to alter the solubility of the resin to a much lower value. For this reason, sensitizers are often referred to as dissolution inhibitors. The photoresist coated substrates described above are then exposed to radiation, most usually to ultraviolet light, through a mask pattern. Those areas of the photoresist layer that receive radiation through the open areas of the mask undergo a chemical change of the sensitizer which renders it soluble in the developer solution. Thus, these areas of polymer are no longer inhibited and will dissolve more rapidly when the substrate is immersed in the developer. After developing in alkaline developer, the substrate bears a relief image of the mask pattern consisting of those areas of photoresist that did not receive exposing radiation.

In regard to the invention, it is in the course of exposure and development that the novel polymers of the invention are distinguished from the prior art. The solubility of the polymer chains is due to the presence of the acidic imide groups, as is disclosed in the copending application of Hopf, et al. (U.S. Ser. No. 547,815) and this is, of course, requisite for use as photoresist. However, the polymers of the invention display several unique and unexpected benefits, derived from the choice of comonomer, which improve greatly on the prior art. First, because the comonomers are chosen to be aliphatic ethers and esters, the resulting copolymers display far superior transmission in the DUV region. For example, a copolymer of maleimide and octadecylvinyl ether has an absorption less than 0.1 for wavelengths greater than 225 nm in a one micron film. This is substantially superior to novolac type resins and is even a definite improvement over maleimide/styrene type polymers.

The importance of low absorption by the resin, in the area of irradiation, is well known to those skilled in the art. Absorption of light by the resin does not do useful photochemistry and so lowers the sensitivity of the resist. If the absorption is excessive, it will also begin to degrade wall profiles in the relief image as exposure will be uneven from top to bottom in the resist. Thus, the polymers of the invention are alkaline soluble vehicles whose superior transmission allows for their use in the practice of microlithography in the DUV, with the attendant benefits described above for short wavelength exposures.

The high transmission of the resin films at 248 nm and 308 nm makes them useful for DUV exposure using excimer lasers, as well as, for conventional lamp exposures. While the maximum DUV transmission is obtained with totally aliphatic comonomers and maleimide, it is possible to use comonomers with some aryl character that are still quite useful in the DUV region, for example, when R or R'' are benzyl or $C_1$ to $C_{10}$ aralkyl. The transmission properties of these variations of the invention are still far superior to novolac type resins in the DUV region.

A second important, and unexpected, characteristic of the polymers of this invention resides in their unusually high adhesion to substrates. The loss of image features during development caused by adhesion loss is one of the most serious problems of photoresist systems. Adhesion loss means that a part of the circuit pattern is missing after development. This will, of course, result in a faulty circuit if the pattern is transferred into the device substrate. The polymers of the invention have been shown to exhibit unexpected tenacity in sticking to substrate materials. They exhibit substantial superiority over the class of maleimide/styrene type copolymers which are the closest resins in the prior art. In addition, they have been shown to be superior even to a novolac resist on some substrate materials, even though novolacs are generally considered good in this regard.

Another important and unexpected characteristic of the polymers of the invention resides in the very high contrast exhibited by resists made from certain members of this class of polymers. When the R group of the vinyl ether or ester is of sufficient length (i.e., number of carbon atoms) it causes the resist made from the corresponding copolymer to exhibit very high contrast in ordinary alkaline developers. Contrast is one of a number of resist performance parameters of importance to microlithographers. The contrast value is a measure of the "sharpness" of the response of the resist system to variations in exposure intensity. Because of the fuzziness of a projected mask image on a photoresist film, some exposure occurs in areas that are meant to be masked over. If the contrast of a resist is high, this will be corrected because the resist/developer system will discriminate between fully exposed and partially exposed areas. A low contrast resist system will not discriminate as well, and the partially irradiated areas will be developed away leaving sloping sidewalls and rounded edges on the relief pattern. The resins of the present invention have normal contrast values when the R group is small, but this value increases dramatically, and unexpectedly, when R is increased above 10 carbons in length.

DETAILED DESCRIPTION OF THE INVENTION

The procedures for making the copolymers of the invention, as well as the preferred method, for utilizing the copolymer in a photoresist composition for use in microlithography is described hereinbelow. The polymers of the invention are produced via free radical polymerizations and are represented by the following structural formula:

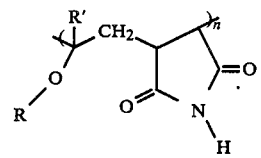

wherein R is an alkyl substituent of from 1 to 20 carbon atoms, benzyl, a $C_1$ to $C_{10}$ aralkyl, a $C_3$ to $C_{12}$ cycloalkyl or

radical where R'' has the structures assigned to R, and R' is independently H, $C_1$ to $C_{10}$ alkyl, phenyl, benzyl or $C_1$ to $C_{10}$ aralkyl. The method of use will be illustrated using maleimide-co-decyl vinyl ether, i.e. where R=n-decyl and R'=H in the formula.

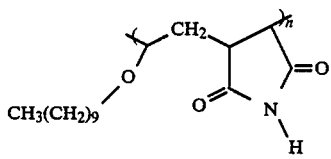

Other polymers were prepared in a like manner from the appropriate vinyl ether or vinyl ester and maleimide.

PREPARATION OF MALEIMIDE/DECYL VINYL ETHER COPOLYMER

To a solution of 1.94 g of recrystallized maleimide (Eastman Kodak) in 20 ml of distilled cyclohexanone were added 3.69 g of decyl vinyl ether (Polysciences) which had been purified by passing through a silica adsorption column. To the mixture were then added 380 $\mu$ml of dodecanethiol followed by 26 mg of azobisisobutyrlnitrile. The vessel was then sealed and deoxygenated with argon followed by placement in an oil bath where the temperature was maintained at 60° C. After six hours, the reaction mixture was poured into 500 ml of water and mixed at high speed with a blender. White precipitate was isolated by filtration. Likewise, the precipitate was mixed with 400 ml of pentene, filtered, isolated and dried overnight at 90° C. to give 4.43 g (79%) of maleimide-decyl vinyl ether copolymer.

PREPARATION OF RESIST FROM MALEIMIDE/DECYL VINYL ETHER COPOLYMER AND A DIAZONAPHTHOQUINONE SENSITIZER

A clean vessel was charged with 20 parts (by weight) of 2-methoxyethyl ether (diglyme) to which was added 8 parts of the polymer described in the preceeding example. The solution was agitated until the polymer was completely dissolved and then 1 part of a diazonaphthoquinone photosensitizer was added and likewise stirred until dissolved. The specific diazonaphthoquinone used was 1-naphthalenesulfonic acid, 3-diazo-3,4-dihydro-4-oxo, 4-benzoyl-1,3-phenylene ester. The solution was filtered through a 0.2 $\mu$m PTFE filter into a clean vessel.

PREPARATION OF A RESIST FILM ON A SUBSTRATE

The filtered solution of the preceeding example was applied to silicon wafers and silicon dioxide coated wafers by spin casting. The solution was pipetted onto the substrate which was positioned on the vacuum chuck of a Headway Research photoresist spinner and then spun at 4100 rpm for a period of 40 seconds. After spin coating, the wafers were placed in a PTFE wafer boat and baked in a convection oven for 40 minutes at 80° C. to drive off the remaining solvent. The wafers were cooled to room temperature before further processing.

EXPOSURE AND DEVELOPMENT OF THE RESIST FILM TO YIELD A RELIEF PATTERN ON THE SUBSTRATE

The resist coated wafer of the previous example was placed on a vacuum chuck positioned under the collimating lens of a DUV exposure system (Optical Associates, Model 30 lightsource fitted with 260 nm optics). A chrome on quartz photomask with a resolution test pattern containing features down to one micron in dimension was placed in contact with the photoresist film on the vacuum chuck. A wide band 260 nm interference filter (Omega Optical, 50 nm FWHM) was placed on top of the mask to insure that only DUV light fell on the photoresist film. The photoresist film was then exposed to 48 mJ/cm$^2$ of this filtered DUV light through the mask. The exposure was calibrated with an Eppley thermopile fitted with a quartz window and the same 260 nm filter. After exposing the wafer coated with resist, the latent image was developed in an aqueous alkaline developer. The preferred developer consisted of 1 part of 25% aqueous tetramethylammonium hydroxide and 1 part reagent grade ammonium hydroxide in 150 parts of water. The development consisted of immersing the wafer in the developer with gentle agitation for a period of 30 seconds followed by rinsing with deionized water and blowing dry with a stream of nitrogen. The film retention in the unirradiated areas was generally greater than 95%. This was determined by measuring the film thickness before and after development with a Rudolf Research interferometric Film Thickness Monitor. The development leaves behind a relief image of resist on the substrate corresponding to the chrome areas of the mask used for exposure. These images were examined with both optical and scanning electron microscopy. The examinations showed that the resist was completely developed to the substrate in the irradiated areas with good resolution of mask features down to one micron in width.

The invention will be further described by the following examples. These examples are illustrative of the unique properties of the polymers of the invention. However, it will be understood that the invention is not limited to the scope of the examples as further modification could be made by those skilled in the art.

EXAMPLE 1

Preparation of Maleimide-Decyl Vinyl Ether Copolymer

To a solution of 0.02 moles (1.94 gm) of recrystallized maleimide in 20 ml of distilled cyclohexanone were added 0.02 moles (3.69 gm) of n-decyl vinyl ether which had been purified by passing through a silica adsorption column. To the mixture were then added 380 $\mu$l of dodecanethiol followed by 26 mg of azobisisobutyrlnitrile. The vessel was then sealed and deoxygenated with argon followed by placement in an oil bath where the temperature was maintained at 60° C. After 6 hours, the reaction mixture was poured into 500 ml of water and mixed at high speed with a blender. The white precipitate was isolated by filtration. Likewise, the precipitate was mixed with 400 ml of pentane, filtered, isolated and dried overnight at 90° C. to give 4.43 gm (79%) of product.

EXAMPLE 2

Preparation of Maleimide-Butyl Vinyl Ether Copolymer

A polymer was prepared in the manner of Example 1, except the comonomer to maleimide was n-butyl vinyl ether. The polymer yield was 54%.

EXAMPLE 3

Preparation of Maleimide-tert-Butyl Vinyl Ether Copolymer

A polymer was prepared in the manner of Example 1, except the comonomer to maleimide was tert-butyl vinyl ether. The polymer yield was 44%.

EXAMPLE 4

Preparation of Maleimide-Hexadecyl Vinyl Ether Copolymer

A polymer was prepared in the manner of Example 1, except the comonomer to maleimide was n-hexadecyl vinyl ether. The polymer yield was 62%.

EXAMPLE 5

Preparation of Maleimide-Octadecyl Vinyl Ether Copolymer

A polymer was prepared in the manner of Example 1, except the comonomer to maleimide was n-octadecyl vinyl ether. The polymer yield was 61%.

EXAMPLE 6

Preparation of Maleimide-Ethylhexyl Vinyl Ether Copolymer

A polymer was prepared in the manner of Example 1, except the comonomer to maleimide was 2-ethylhexyl vinyl ether. The polymer yield was 59%.

EXAMPLE 7

Preparation of Maleimide-Vinyl-2-Ethylhexanoate Copolymer

A polymer was prepared in the manner of Example 1, except the comonomer to maleimide was vinyl-2-ethyl-hexanoate (vinyl ester) and the reaction time was 25 hours. The polymer yield was 57%.

EXAMPLE 8

Preparation of Maleimide-Phenyl Vinyl Acetate Copolymer

A polymer was prepared in the manner of Example 1, except the comonomer to maleimide was phenyl vinyl acetate, a vinyl ester of the general structure where

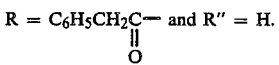

$R = C_6H_5CH_2\underset{\underset{O}{\|}}{C}-$ and $R'' = H$.

The polymer yield was 17%.

EXAMPLE 9

Preparation of Maleimide-Decyl Vinyl Ether Copolymer in a Photoresist

The polymer of Example 1 was compounded at a polymer to sensitizer ratio of 7:1 (w/w) with a suitable diazonaphthoquinone photosensitizer (1-naphthalene sulfonic acid, 3-diazo-3,4-dihydro-4-oxo, 4-benzoyl-1,3-phenylene ester) in diglyme such that the total solid content of the resist was 31%. The photoresist solution was spun cast on a silicon wafer which had been prior exposed to vapor phase 1,1,1,3,3,3,-hexamethyldisilazane for 10 minutes. The HMDS vapor is a common pretreatment for wafers, intended to improve resist adhesion. The spun films were baked in a convection oven for 40 minutes at 80° C. and then cooled to room temperature. The baked films had a thickness of approximately one micron. The photoresist film on the substrate was then exposed through a chrome on quartz photomask to 48 mJ/cm² of DUV light centered at 260 nm. The exposed film was then dip developed in an alkaline developer consisting of 1 part 25% tetramethylammonium hydroxide (TMAH) and 1 part reagent grade ammonium hydroxide in 150 parts of water for a period of 30 seconds. The substrate bearing the relief image was rinsed in deionized water and blown dry. The relief image showed complete clearing of the irradiated areas and good resolution of one micron features. The film retention was found to be 96% in the unirradiated areas.

EXAMPLE 10

Use of Maleimide-Octadecyl Vinyl Ether Copolymer in a Photoresist

A resist solution was prepared in the manner of Example 9, except the polymer was the maleimide, n-octadecyl vinyl ether copolymer of Example 5. The resist was spun cast and baked in the manner of Example 9. The photoresist layer on the substrate was exposed to 160 mJ/cm² through a step tablet mask (Ditric Optics) containing areas of variable partial transmission in order to determine the contrast of the resist. The exposed film on the silicon substrate was developed for 40 seconds in an alkaline solution consisting of 1 part 25% tetramethylammonium hydroxide in 75 parts of water. All the steps with transmission values greater than or equal to 22%T were cleaned out and all steps with transmission values less than 22%T did not clear out and remained at full original film thickness. That is, the bulk sensitivity of the resist was 35 mJ/cm² and its contrast was very high ($\gamma > 10$). This illustrates the unusual and unexpected high contrast found in resist for which the vinyl ether portion of the polymer contains a long chain of carbon atoms ($R = C_{12}$ to $C_{20}$). In comparison, the contrast value for a conventional novolac-based resist is on the order of $\beta = 2$.

EXAMPLE 11

Use of Maleimide-Hexadecyl Vinyl Ether Copolymer in a Photoresist

A photoresist was compounded in the manner of Example 9 except the polymer used was maleimide, n-hexadecyl vinyl ether copolymer (also called maleimide-cetyl vinyl ether copolymer). The photoresist was spun coated and baked as in Example 9 and then exposed as in Example 10. The photoresist was developed for a period of 1 minute in a developer consisting of 1 part (by volume) 25% tetramethyl-ammonium hydroxide and 2 parts of reagent grade ammonium hydroxide in 150 parts of water. This resist system also exhibited unexpectedly high contrast, although not quite as high as in Example 10, and had a bulk sensitivity of 64 mJ/cm².

EXAMPLE 12

Use of Maleimide-2-Ethylhexyl Vinyl Ether Copolymer in a Photoresist

A photoresist was compounded in the manner of Example 9, except the polymer used was maleimide, 2-ethylhexyl vinyl ether copolymer. The photoresist was spun coated, baked and exposed as in Example 9. The exposed wafer was developed for a period of 2.5 minutes in an alkaline developer solution consisting of 0.01N potassium hydroxide. The features were well cleared out with resolution to 1 μm and the film retention in the unirradiated areas was 90%.

EXAMPLE 13

Adhesion Properties of Maleimide-Decyl Vinyl Ether Copolymer Compared to Prior Art Three photoresist solutions were prepared in order to compare the adhesion properties of the current invention to that of the closest art, that being the maleimide/styrene and maleimide/4-substituted styrenes disclosed in the co-pending application of Hopf, et al., U.S. Ser. No. 547,815. The three polymers used were maleimide, n-decyl vinyl ether copolymer (this invention), maleimide/styrene copolymer and maleimide/4-tert-butyl styrene copolymer (prior art). Each polymer was compounded in a photoresist solution with the diazonaphthoquinone sensitizer of Example 9. Each solution was spin coated on silicon wafers, but unlike the case of Example 9, the wafers received no pretreatment with HMDS which is used by those skilled in the art to promote adhesion. All wafers were baked in a convection oven for 40 minutes at 80° C. and then cooled to room temperature. A wafer of each type was exposed to 160 mJ/cm$^2$ of DUV light centered at 260 nm through a chrome on quartz step tablet mask. The wafer coated with resist made from maleimide/styrene copolymer was developed in 0.01N TMAH, but suffered gross delamination of image features before the step corresponding to 60% transmission was fully cleared. The wafer coated with resist made from maleimide/4-tert-butyl styrene copolymer was developed in 0.14N TMAH, but it also suffered gross delamination of resist features before the step corresponding to 40%T cleared. The wafer coated with resist made from maleimide/decyl vinyl ether copolymer (of the present invention) was developed in 0.02N TMAH until the step corresponding to 30%T was cleared. Microscopic examination determined that all mask features were present on the wafer with no evidence of any delamination occurring. It is quite unexpected that the polymers of the present invention should show such a striking improvement in adhesion over these closest members of the prior art.

EXAMPLE 14

Adhesion Properties of Maleimide-n-decyl Vinyl Ether Copolymer Compared to Prior Art A photoresist compounded from maleimide, n-decyl vinyl ether copolymer was compared to a commercial novolac type photoresist for adhesion to substrates. As in Example 13 no HMDS was used on the silicon wafers; and in addition, the wafers were soaked in dilute sulfuric acid before use to hydrolyze the surface. The effect of this pretreatment was to make the resist/substrate interface more hydrophilic and in so doing, make the wafer substrate harder to stick to. The resists were spun and baked as in Example 13. The resist coated wafers were exposed through a step table mask as in Example 13, except that the commercial novolac-type resist was exposed in the NUV (for reasons explained in the Background of the Invention). Wafers coated with each resist were developed in aqueous alkaline TMAH developers appropriate for each resist until the 30% transmission steps were cleared out. Microscopic examination of the wafers showed that all resist features were present in the case of maleimide/n-decyl vinyl ether copolymer, but that several resist lines were missing (i.e., delaminated) on each of the steps of the novolac resist coated wafer. Thus, on this particular substrate the polymers of the present invention were shown to be superior in terms of adhesion than a novolac-based resist notwithstanding the impression that the art generally regards novolac-type resists to be superior in terms of adhesion.

EXAMPLE 15

Adhesion Properties of Maleimide-n-decyl Vinyl Ether Copolymer Compared to the Prior Art The adhesion test described in Example 14 was repeated except the substrates used were silicon wafers with a layer of thermally grown silicon dioxide ($SiO_2$) on them. For this particular substrate, the resist of the invention and the commercial novolac-based resist showed equal ability to adhere to the substrate during development.

EXAMPLE 16

Transparency of Maleimide/Vinyl Ether Copolymers in the DUV

A copolymer of maleimide and octadecyl vinyl ether was dissolved is diglyme and spun cast on a quartz disc. The disc was dried in a convection oven for 40 minutes at 80° C. to leave a dry polymer film 1 μm thick on its surface. This disc was put in the sample beam of a Perkin-Elmer UV/VIS spectrophotometer to measure the absorption spectrum of the polymer. An uncoated quartz disc was placed in the reference beam of the spectrophotometer. The recorded absorption spectrum showed the film to be highly transparent in the DUV region with an absorption less than 0.1 for all ultraviolet and visible wavelengths greater than 225 nm. The "DUV cut-off", where the material beings to absorb very strongly, is at 210 nm. By comparison to the prior art, maleimide-4-tert-butyl styrene copolymer has a DUV cut-off of 235 nm and a novolac-type resin has its cut-off at 295 nm (or essentially all of the DUV region is cut off).

While particular embodiments of the invention have been described, it will be understood, of course, that the invention is not limited thereto since various modifications may be made, and it is, therefore, contemplated to cover by the appended claims any such modifications as fall within the true spirit and scope of the invention.

What is claimed is:

1. A positive photoresist composition comprising a mixture of:
   (a) 1 to 35 dry weight percent of an alkali-insoluble photoactive compound, capable of being transferred into an alkali-soluble species upon exposure to actinic radiation, in an amount sufficient to render the mixture alkali-insoluble prior to exposure; and
   (b) 65-99 dry weight percent of a film forming copolymer of maleimide and a vinyl ether or vinyl ester having the structure:

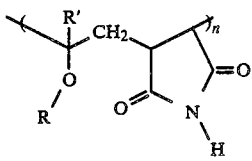

where R is an alkyl substitutent of from 1 to 20 carbon atoms, $R^1$ is independently H, $C_1$ to $C_{10}$ alkyl, phenyl, benzyl, or $C_1$ to $C_{10}$ aralkyl and wherein said copolymer has a sufficient number of imide N—H groups to render the mixture soluble in aqueous alkali after exposure; and (c) a solvent capable of dissolving both the polymer and the photoactive compound.

2. The photoresist composition of claim 1 wherein the photoactive compound is a diazonaphthoquinone sulfonic acid ester or amide.

3. The photoresist of claim 1 wherein the photoactive compound is a diazobarbituric acid derivative.

4. The photoresist composition of claim 1 wherein the imide containing polymer is poly(maleimide-co-n-decyl vinyl ether).

5. The photoresist composition of claim 1 wherein the imide containing polymer is poly(maleimide-co-n-dodecyl vinyl ether).

6. The photoresist composition of claim 1 wherein the imide containing polymer is poly(maleimide-co-n-tetradecyl vinyl ether).

7. The photoresist composition of claim 1 wherein the imide containing polymer is poly(maleimide-co-n-hexadecyl vinyl ether).

8. The photoresist composition of claim 1 wherein the imide containing polymer is poly(maleimide-co-n-octadecyl vinyl ether).

9. The photoresist composition of claim 1 wherein the solvent is 2-methoxyethyl ether (diglyme).

10. A photosensitive element comprising a substrate bearing a layer of a photoresist composition comprising a mixture of:

(a) 1 to 35 weight percent of an alkali-insoluble photoactive compound, capable of being transformed into an alkali-soluble species upon exposure to actinic radiation, in an amount sufficient to render the mixture alkali-insoluble prior to exposure; and (b) 65-99 dry weight percent of a film forming copolymer of maleimide and a vinyl ether or vinyl ester having the structure:

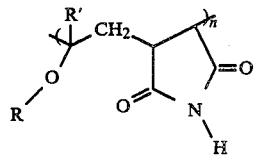

where R is an alkyl substitutent of from 1 to 20 carbon atoms, $R^1$ is independently H, $C_1$ to $C_{10}$ alkyl, phenyl, benzyl, or $C_1$ to $C_{10}$ aralkyl and wherein said copolymer has a sufficient number of imide N—H groups to render the mixture soluble in aqueous alkali after exposure.

* * * * *